US009825480B2

(12) United States Patent
Kung

(10) Patent No.: US 9,825,480 B2
(45) Date of Patent: *Nov. 21, 2017

(54) APPARATUS FOR PERFORMING HYBRID POWER CONTROL IN AN ELECTRONIC DEVICE WITH AID OF SEPARATED POWER OUTPUT NODES FOR MULTI-PURPOSE USAGE OF BOOST

(71) Applicant: MEDIATEK INC., Hsin-Chu (TW)

(72) Inventor: Nien-Hui Kung, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 173 days.

This patent is subject to a terminal disclaimer.

(21) Appl. No.: 14/922,192

(22) Filed: Oct. 25, 2015

(65) Prior Publication Data

US 2016/0233712 A1 Aug. 11, 2016

Related U.S. Application Data

(63) Continuation-in-part of application No. 14/738,947, filed on Jun. 15, 2015, now Pat. No. 9,731,613.
(Continued)

(51) Int. Cl.
*H02J 7/00* (2006.01)
*B60L 11/18* (2006.01)
(Continued)

(52) U.S. Cl.
CPC ......... *H02J 7/0072* (2013.01); *B60L 11/1824* (2013.01); *B60L 11/1851* (2013.01);
(Continued)

(58) Field of Classification Search
CPC .................................................. B60L 11/1824
(Continued)

(56) References Cited

U.S. PATENT DOCUMENTS 9,237,211 B2 1/2016 Tabe
2008/0265839 A1 10/2008 Yang
(Continued)

OTHER PUBLICATIONS

Texas Instruments, bq2416xx 2.5A, Dual-Input, Single-Cell Switched-Mode Li-Ion Battery Charger with Power Path Management and I2C Interface, bq24160, bq24160A, bq24161, bq24161B, bq24163, bq24168, Nov. 2011, XP055284945.

*Primary Examiner* — Edward Tso
*Assistant Examiner* — Ahmed Omar
(74) *Attorney, Agent, or Firm* — Winston Hsu

(57) ABSTRACT

An apparatus for performing hybrid power control in an electronic device includes a charger positioned in the electronic device, and the charger is arranged for selectively charging a battery of the electronic device. In addition, at least one portion of the charger is implemented within a charger chip. For example, the charger may include: a first terminal, positioned on the charger chip; a second terminal, positioned on the charger chip and selectively coupled to the first terminal; a third terminal, positioned on the charger chip and selectively coupled to the second terminal; a fourth terminal, positioned on the charger chip and coupled to the third terminal; a first power output path, coupled to the fourth terminal, arranged for providing a first voltage level; and a second power output path, coupled to the third terminal, arranged for selectively providing a second voltage level that is greater than the first voltage level.

40 Claims, 13 Drawing Sheets

Related U.S. Application Data

(60) Provisional application No. 62/115,121, filed on Feb. 11, 2015.

(51) Int. Cl.
    *H02J 7/04*     (2006.01)
    *H02M 3/158*     (2006.01)
    *H03K 17/06*     (2006.01)
    *H02J 7/02*     (2016.01)
    *H05B 33/08*     (2006.01)
    *H02M 3/156*     (2006.01)

(52) U.S. Cl.
    CPC ............ *H02J 7/0068* (2013.01); *H02J 7/022* (2013.01); *H02J 7/04* (2013.01); *H02J 7/045* (2013.01); *H02M 3/1588* (2013.01); *H03K 17/063* (2013.01); *H05B 33/0815* (2013.01); *H05B 33/0827* (2013.01); *H02M 3/156* (2013.01); *H03K 2017/066* (2013.01); *Y02B 70/1466* (2013.01); *Y02T 90/127* (2013.01)

(58) Field of Classification Search
    USPC .................................................. 320/128, 137
    See application file for complete search history.

(56) References Cited

U.S. PATENT DOCUMENTS

2014/0062435 A1     3/2014   Lu
2016/0087462 A1     3/2016   Kudo

APPARATUS FOR PERFORMING HYBRID POWER CONTROL IN AN ELECTRONIC DEVICE WITH AID OF SEPARATED POWER OUTPUT NODES FOR MULTI-PURPOSE USAGE OF BOOST

CROSS REFERENCE TO RELATED APPLICATION

This application claims the benefit of U.S. Provisional Application No. 62/115,121, which was filed on Feb. 11, 2015, and is included herein by reference. In addition, this application is a continuation-in-part application and claims the benefit of U.S. Non-provisional application Ser. No. 14/738,947, which was filed on Jun. 15, 2015, and is included herein by reference. Additionally, the U.S. Non-provisional application Ser. No. 14/738,947 claims the benefit of the U.S. Provisional Application No. 62/115,121, which was filed on Feb. 11, 2015.

BACKGROUND

The present invention relates to charger control in a portable electronic device, and more particularly, to an apparatus for performing hybrid power control in an electronic device.

FIG. 1 illustrates a conventional charger system according to the related art, where this conventional charger system may be implemented within a conventional multifunctional mobile phone for charging a battery thereof, such as that coupled to the terminal VBAT. The conventional charger system may comprise some switching units such as the Metal Oxide Semiconductor Field Effect Transistors (MOSFETs) M1, M2, MA, and MB, some drivers such as those driving these MOSFETs M1, M2, MA, and MB through their gate terminals, and some switching control circuits such as the control circuit Ctrl_A arranged for controlling switching operations of the MOSFETs M1 and M2, the control circuit Ctrl_1 arranged for controlling switching operations of the MOSFET MA and MB, and the control circuit Ctrl_2 arranged for controlling switching operations of the MOSFET coupled between the terminals VSYS and VBAT. For example, when the user is taking a photo with the flash, this conventional charger system may perform a reverse boost operation and output power through the flash path (labeled "FLASH path by reverse boost" in FIG. 1, for better comprehension) toward the light emitting diodes (LEDs) shown around the lower right corner of FIG. 1, and the MOSFETs M21 and M22 may be utilized as the trigger module of the flash. In another example, when the user is using the LEDs as a torch, rather than the flash for photography, this conventional charger system may output power through the torch path (labeled "TORCH path by VSYS" in FIG. 1, for better comprehension) toward the LEDs, and the MOSFETs M23 and M24 may be utilized as the switching module of the torch. Please note that this conventional charger system may be suitable for the conventional multi-functional mobile phone in a situation where the input voltage at the terminal VIN for obtaining external power from outside the conventional multifunctional mobile phone is greater than a typical flash voltage level on the flash path since one of the MOSFETs M1 and M2 with different body diode directions may fully block the path between the terminals VIN and VM to protect the components within the conventional charger system. However, during charging the battery by using an external power supply such as an alternating current/direct current (AC/DC) adapter, the series of resistance due to the MOSFETs M1, M2, and MA is large, which typically reduces the power efficiency on the power transmission path from the terminal VIN to the terminal VSYS.

FIG. 2 illustrates another conventional charger system according to the related art, where this conventional charger system may also be implemented within the conventional multifunctional mobile phone for charging the battery thereof, such as that coupled to the terminal VBAT. The MOSFET M2 shown in FIG. 1 is absent in the conventional charger system shown in FIG. 2, and the control circuit Ctrl_A described above is replaced by the control circuit Ctrl_B arranged for controlling switching operations of the MOSFET M1. In comparison with the conventional charger system shown in FIG. 1, as the number of MOSFETs on the path between the terminals VIN and VM is reduced, the power efficiency on the power transmission path from the terminal VIN to the terminal VSYS in the conventional charger system shown in FIG. 2 is greater than that of the architecture shown in FIG. 1. However, the MOSFET M1 cannot fully block the path between the terminals VIN and VM in each of various situations. For example, the body diode direction of the MOSFET M1 may be equivalent to the direction from the terminal VIN to the terminal VM, and the reverse boost voltage level at the terminal VM for flash usage must be higher than the input voltage level at the terminal VIN. As a result, the power efficiency on the power transmission path from the terminal VSYS to the terminal VM is poor.

In conclusion, there are many problems in the conventional charger systems, and each of the conventional charger systems cannot guarantee high power efficiency in each of various situations. Thus, a novel architecture is required to improve the power efficiency, in order to guarantee the overall performance of the whole system.

SUMMARY

It is an objective of the claimed invention to provide an apparatus for performing hybrid power control in an electronic device, in order to solve the above-mentioned problems.

It is another objective of the claimed invention to provide an apparatus for performing hybrid power control in an electronic device, in order to increase the power efficiency in each of various situations.

It is another objective of the claimed invention to provide an apparatus for performing hybrid power control in an electronic device, in order to enhance the overall performance of the electronic device.

According to at least one preferred embodiment, an apparatus for performing hybrid power control in an electronic device is provided, where the apparatus may comprise at least one portion (e.g. a portion or all) of the electronic device. For example, the apparatus may comprise a charger that is positioned in the electronic device, and the charger may be arranged for selectively charging a battery of the electronic device, wherein at least one portion (e.g. a portion or all) of the charger may be implemented within a charger chip. More particularly, the charger may comprise: a first terminal, positioned on the charger chip; a second terminal, positioned on the charger chip and selectively coupled to the first terminal; a third terminal, positioned on the charger chip and selectively coupled to the second terminal; a fourth terminal, positioned on the charger chip and coupled to the third terminal; a first power output path, coupled to the fourth terminal; and a second power output path, coupled to the third terminal. For example, the first terminal is arranged for coupling the charger to a power input port of the electronic device, wherein the power input port is utilized for selectively obtaining external power from outside the electronic device. In addition, the second terminal is utilized for selectively inputting the external power into at least one internal component of the charger chip when needed, and the third terminal is arranged for interconnecting partial paths between components within the charger, wherein the third terminal is utilized for selectively bypassing the external power when needed. Additionally, the fourth terminal is arranged for interconnecting a battery path from the battery and another partial path within the charger. Further, the first power output path is arranged for providing a first voltage level, and the second power output path is arranged for selectively providing a second voltage level, wherein the second voltage level is greater than the first voltage level.

It is an advantage of the present invention that the present invention apparatus can increase the power efficiency in each of various situations. In addition, the present invention apparatus can enhance the overall performance of the electronic device.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . .". Also, the term "couple" is intended to mean either an indirect or direct electrical connection. Accordingly, if one device is coupled to another device, that connection may be through a direct electrical connection, or through an indirect electrical connection via other devices and connections.

Figure 3:
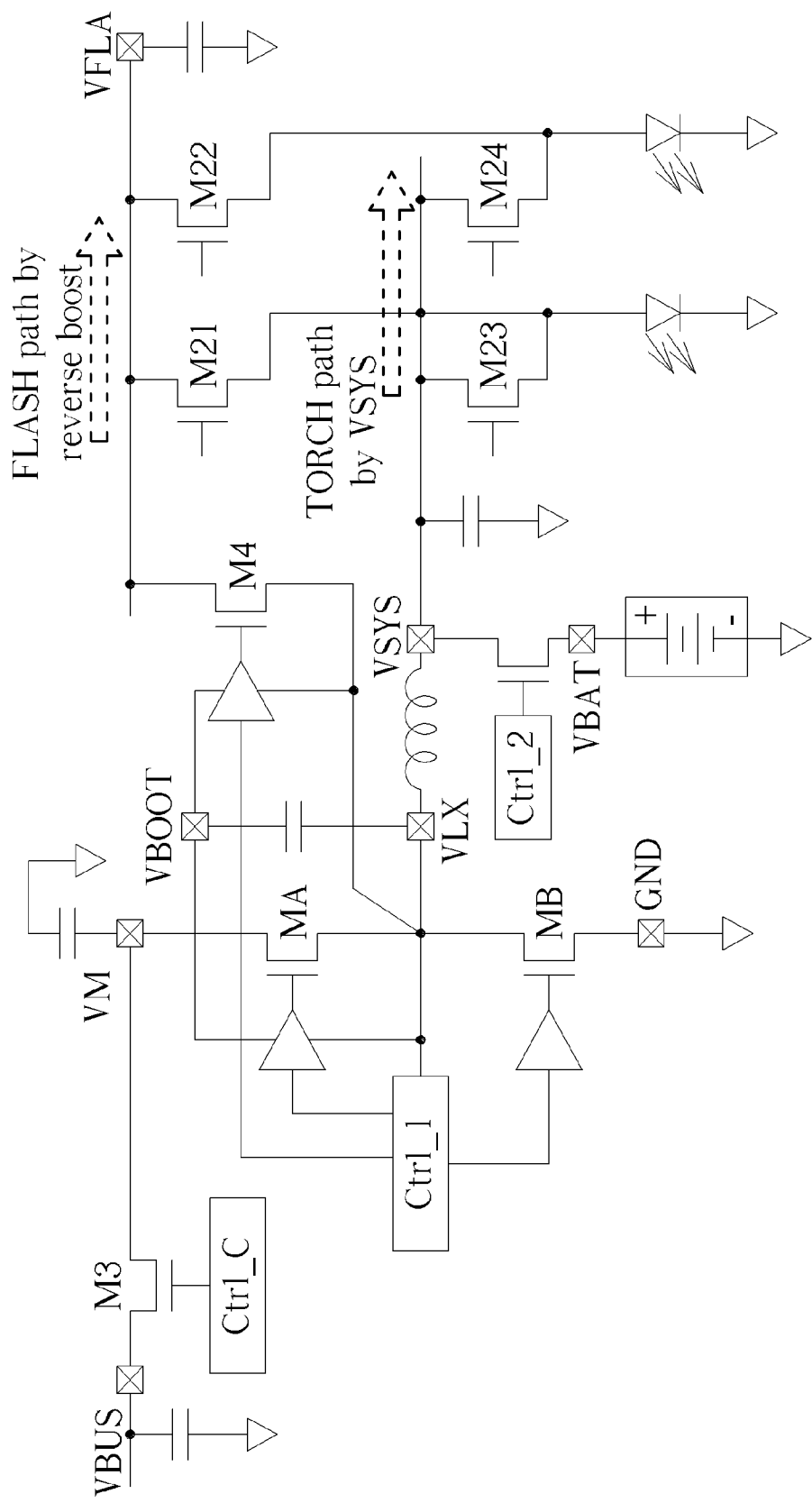
FIG. 3 is a diagram of an apparatus for performing hybrid power control in an electronic device according to an embodiment of the present invention.

FIG. 3 is a diagram of an apparatus for performing hybrid power control in an electronic device according to an embodiment of the present invention, where the apparatus may comprise at least one portion of the electronic device. For example, the apparatus may comprise a portion of the electronic device mentioned above, and more particularly, can be at least one hardware circuit such as at least one integrated circuit (IC) within the electronic device and associated circuits thereof. In another example, the apparatus can be the whole of the electronic device mentioned above. In another example, the apparatus may comprise a system comprising the electronic device mentioned above (e.g. a wireless communications system comprising the electronic device). Examples of the electronic device may include, but not limited to, a multifunctional mobile phone, a tablet, and a laptop computer.

According to this embodiment, the apparatus may comprise a charger that is positioned in the electronic device, and the charger may be arranged for selectively charging a battery of the electronic device (e.g. the battery shown below the terminal VBAT in FIG. 3), where at least one portion (e.g. a portion or all) of the charger may be implemented within a charger chip, which can be taken as an example of the IC. For better comprehension, the pad notation of a square labeled "X" therein can be utilized for presenting a pad of the IC, such as an input/output (I/O) pad of the IC. As shown in FIG. 3, the charger may comprise: a first terminal (e.g. a terminal next to the terminal VBUS in FIG. 3, such as a pad electrically connected to the terminal VBUS, directly), positioned on the charger chip; a second terminal (e.g. the terminal VM such as a pad), positioned on the charger chip and selectively coupled to the first terminal; a third terminal (e.g. the terminal VLX such as a pad), positioned on the charger chip and selectively coupled to the second terminal; a fourth terminal (e.g. the terminal VSYS such as a pad), positioned on the charger chip and coupled to the third terminal; a first power output path that is coupled to the fourth terminal; and a second power output path that is coupled to the third terminal. More particularly, the first power output path may represent at least one portion of the signal path from the terminal VSYS toward the right in FIG. 3, such as a torch path (labeled "TORCH path by VSYS" in FIG. 3, for better comprehension), and the second power output path may represent at least one portion of the signal path from the terminal VLX toward the terminal VFLA in FIG. 3, such as a flash path (labeled "FLASH path by reverse boost" in FIG. 3, for better comprehension).

For example, the first terminal (e.g. the terminal next to the terminal VBUS in FIG. 3, such as the pad electrically connected to the terminal VBUS, directly) is arranged for coupling the charger to a power input port of the electronic device, where the power input port is utilized for selectively obtaining external power from outside the electronic device, and the terminal VBUS can be a terminal of the power input port. In addition, the second terminal (e.g. the terminal VM) is utilized for selectively inputting the external power into at least one internal component of the charger chip when needed, and the third terminal (e.g. the terminal VLX) is arranged for interconnecting partial paths between components within the charger, where the third terminal is utilized for selectively bypassing the external power when needed. Additionally, the fourth terminal (e.g. the terminal VSYS) is arranged for interconnecting a battery path from the battery (e.g. a section of path below the terminal VSYS in FIG. 3) and another partial path within the charger (e.g. a section of path at the left of the terminal VSYS in FIG. 3). Further, the first power output path (e.g. this torch path) is arranged for providing a first voltage level, and the second power output path (e.g. this flash path) is arranged for selectively providing a second voltage level, where the second voltage level is greater than the first voltage level.

As shown in FIG. 3, the charger may further comprise a switching unit that is coupled between the first terminal (e.g. the terminal next to the terminal VBUS in FIG. 3, such as the pad electrically connected to the terminal VBUS, directly) and the second terminal (e.g. the terminal VM), and this switching unit may be arranged for selectively enabling or disabling a signal path between the first terminal and the second terminal, where no other switching unit is coupled between the first terminal and the second terminal. For example, this switching unit can be a Metal Oxide Semiconductor Field Effect Transistor (MOSFET) M3 positioned on the charger chip, and the body diode direction of the MOSFET M3 is equivalent to the direction from the first terminal to the second terminal on this signal path. In this embodiment, the body diode direction of the MOSFET M3 is also equivalent to the direction from the terminal VBUS to the terminal VM. In addition, the charger may further comprise a switching unit that is coupled between the second terminal (e.g. the terminal VM) and the third terminal (e.g. the terminal VLX), and this switching unit may be arranged for selectively enabling or disabling a signal path between the second terminal and the third terminal. For example, this switching unit can be a MOSFET MA positioned on the charger chip, and the body diode direction of the MOSFET MA is equivalent to the direction from the third terminal to the second terminal on this signal path. More particularly, when the second power output path (e.g. the flash path) is outputting power toward a load within the electronic device, the apparatus may utilize this switching unit such as the MOSFET MA to disable the signal path between the second terminal and the third terminal. Additionally, the charger may comprise a ground terminal GND (such as a pad) that is positioned on the charger chip, and may further comprise a switching unit that is coupled between the third terminal (e.g. the terminal VLX) and the ground terminal GND, and this switching unit may be arranged for selectively enabling or disabling a signal path between the third terminal and the ground terminal GND. For example, this switching unit can be a MOSFET MB positioned on the charger chip, and the body diode direction of the MOSFET MB is equivalent to the direction from the ground terminal GND to the third terminal on this signal path. Further, the charger may comprise a fifth terminal (e.g. the terminal VFLA such as a pad) that is positioned on the charger chip, where the fifth terminal may be arranged for coupling an external component of the charger chip to the charger chip. The charger may further comprise a switching unit that is coupled between the third terminal (e.g. the terminal VLX) and the fifth terminal, and this switching unit may be arranged for selectively enabling or disabling a signal path between the third terminal and the fifth terminal, where the second power output path is coupled to the third terminal through this switching unit. For example, this switching unit can be a MOSFET M4 positioned on the charger chip, and the body diode direction of the MOSFET M4 is equivalent to the direction from the third terminal to the fifth terminal on this signal path.

In this embodiment, the apparatus may utilize at least one control circuit such as a set of control circuits {Ctrl_C, Ctrl_1, Ctrl_2} to control switching operations of a plurality of switching units of the charger, such as the MOSFETs M3, MA, MB, and M4 and the MOSFET coupled between the terminal VSYS and the terminal VBAT (such as a pad), and to control switching operations of other switching units within the electronic device, such as the MOSFETs M21, M22, M23, and M24. For example, when some of the plurality of switching units, such as the MOSFETs M4 and MB, are programmed as a portion of a boost circuit within the charger, for outputting power through the second power output path (e.g. the flash path), another of the plurality of switching units, such as the MOSFET M3, disables the signal path between the first terminal and the second terminal (e.g. the signal path controlled by the MOSFET M3) and yet another of the plurality of switching units, such as the MOSFET MA, disables the signal path between the second terminal and the third terminal (e.g. the signal path controlled by the MOSFET MA). In another example, when some of the plurality of switching units, such as the MOSFETs MA, MB, and M3, are programmed as a portion of a buck circuit within the charger, for transmitting the external power to the fourth terminal, another of the plurality of switching units, such as the MOSFET M4, disables the signal path between the third terminal and the fifth terminal (e.g. the signal path controlled by the MOSFET M4).

In addition, at least one switching unit within the electronic device (e.g. the MOSFETs M21, M22, M23, and M24) may be coupled to at least one load within the electric device (e.g. the LEDs) and coupled to at least one power output path within the first power output path and the second power output path (e.g. one or more power output paths within the torch path and the flash path), and may be arranged for selectively driving the aforementioned at least one load with the power output through one of the first power output path and the second power output path (e.g. the torch path or the flash path), respectively. As shown in FIG. 3, the charger may comprise a capacitor that is coupled to the third terminal (e.g. the terminal VLX), and may further comprise an inductor that is coupled between the third terminal and the fourth terminal (e.g. the terminal VSYS). More particularly, this capacitor is coupled between the terminal VLX and the terminal VBOOT (such as a pad). In addition to this capacitor, the charger may further comprise a capacitor that is coupled to the second terminal (e.g. the terminal VM). In addition to the above described capacitors, the apparatus may comprise some capacitors that are coupled to the terminals VSYS, VFLA, and VBUS, respectively. In practice, a portion of the plurality of switching units, such as the MOSFETs MA, MB, and M4, may need drivers for driving the portion of the plurality of switching units through their gate terminals, respectively.

Additionally, the first power output path (e.g. the torch path) may be arranged for providing one load of a plurality of loads within the electronic device with the first voltage level, and the second power output path (e.g. the flash path) may be arranged for selectively providing another load of the plurality of loads within the electronic device with the second voltage level. For example, this load (i.e. the aforementioned one load of the plurality of loads) may comprise a main circuit of the electronic device, and the other load (i.e. the other of the plurality of loads) may comprise at least one LED (e.g. all of the LEDs shown in FIG. 3). In a situation where the electronic device is the multifunctional mobile phone mentioned above, the main circuit may comprise at least one processor and some associated sub-circuits coupled to the aforementioned at least one processor. Please note that, by providing the aforementioned at least one LED (e.g. all of the LEDs shown in FIG. 3) with the second voltage level, the apparatus may selectively drive the aforementioned at least one LED to act as a flash of the electronic device. For example, when the user is taking a photo with the flash of the multifunctional mobile phone, the apparatus may perform a reverse boost operation and may output power through the second power output path such as the flash path toward the LEDs shown around the lower right corner of FIG. 3, and the MOSFETs M21 and M22 may be utilized as the trigger module of the flash. This is for illustrative purposes only, and is not meant to be a limitation of the present invention. Please note that the first power output path of this embodiment may be further arranged for selectively providing the other load within the electronic device with the first voltage level. By providing the aforementioned at least one LED with the first voltage level, the apparatus may selectively drive the aforementioned at least one LED to act as a torch of the electronic device. For example, when the user is using the LEDs as a torch of the multifunctional mobile phone, rather than the flash for photography, the apparatus may output power through the first power output path such as the torch path toward the LEDs, and the MOSFETs M23 and M24 may be utilized as the switching module of the torch.

According some embodiments, while the other load may still comprise the aforementioned at least one LED, the torch path may be absent in the apparatus of any of these embodiments. For example, all of the LEDs shown in FIG. 3 are not coupled to the terminal VSYS in these embodiments. In addition, by providing the aforementioned at least one LED with the second voltage level for a first time period, the apparatus may selectively drive the aforementioned at least one LED to act as a flash of the electronic device. Additionally, by providing the aforementioned at least one LED with the second voltage level for a second time period, the apparatus may selectively drive the aforementioned at least one LED to act as a torch of the electronic device, where the second time period is greater than the first time period.

According some embodiments, the switching unit that is coupled between the fourth terminal and the battery, such as the MOSFET coupled between the terminal VSYS and the terminal VBAT, may be arranged for selectively enabling or disabling the signal path between the fourth terminal and the battery. This is for illustrative purposes only, and is not meant to be a limitation of the present invention. According some embodiments, the battery may be electrically connected to the fourth terminal, directly.

According some embodiments, one or more of the plurality of switching units of the charger (e.g. the MOSFETs M3, MA, MB, and M4 and the MOSFET coupled between the terminal VSYS and the terminal VBAT) may be N-type MOSFETs (NMOSFETs). For example, in the architecture shown in FIG. 3, all of the MOSFETs M3, MA, MB, and M4 and the MOSFET coupled between the terminal VSYS and the terminal VBAT may be NMOSFETs. This is for illustrative purposes only, and is not meant to be a limitation of the present invention. According some embodiments, one or more of the plurality of switching units of the charger, such as one or more of the MOSFETs M3, MA, and M4) may be P-type MOSFETs (PMOSFETs). For example, in the architecture shown in FIG. 3, the MOSFETs MA, MB, and M4 and the MOSFET coupled between the terminal VSYS and the terminal VBAT may be NMOSFETs, and the MOSFET M3 may be a PMOSFET. In some examples, one or more MOSFETs within the plurality of switching units, such as one or more of the MOSFETs M3, MA, and M4, may be PMOSFETs, and the other MOSFETs within the plurality of switching units may be NMOSFETs.

Figure 4:
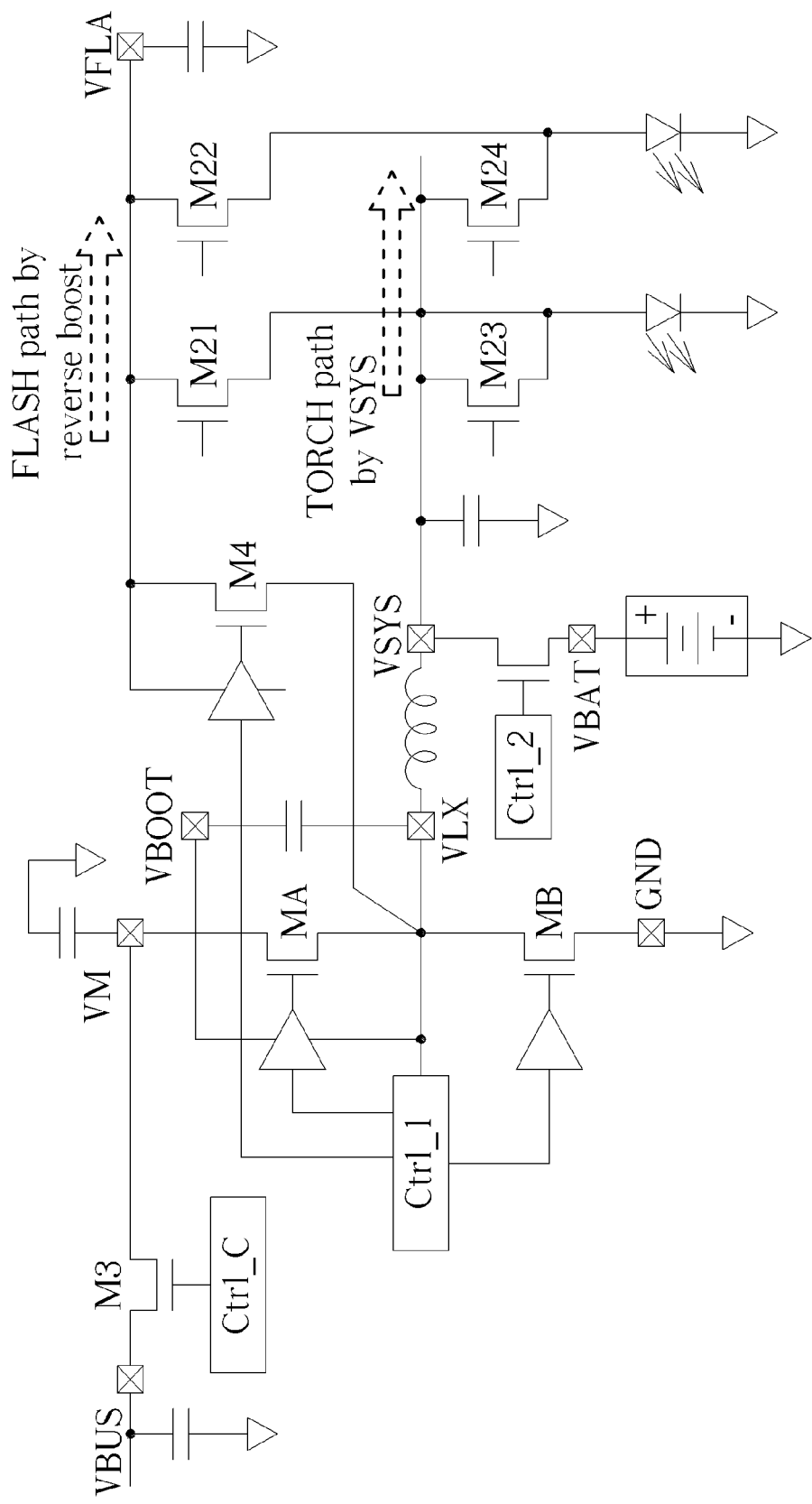
FIG. 4 is a diagram of an apparatus for performing hybrid power control in an electronic device according to another embodiment of the present invention.

FIG. 4 is a diagram of an apparatus for performing hybrid power control in an electronic device according to another embodiment of the present invention. In comparison with the apparatus shown in FIG. 3, while the MOSFET MA may still be an NMOSFET, the MOSFET M4 may be a PMOSFET, and the driving voltage levels respectively applied to the upper and the lower driving voltage terminals of the driver controlling the gate of the MOSFET M4, together with the associated connections, may be changed accordingly. For brevity, similar descriptions for this embodiment are not repeated in detail here.

Figure 5:
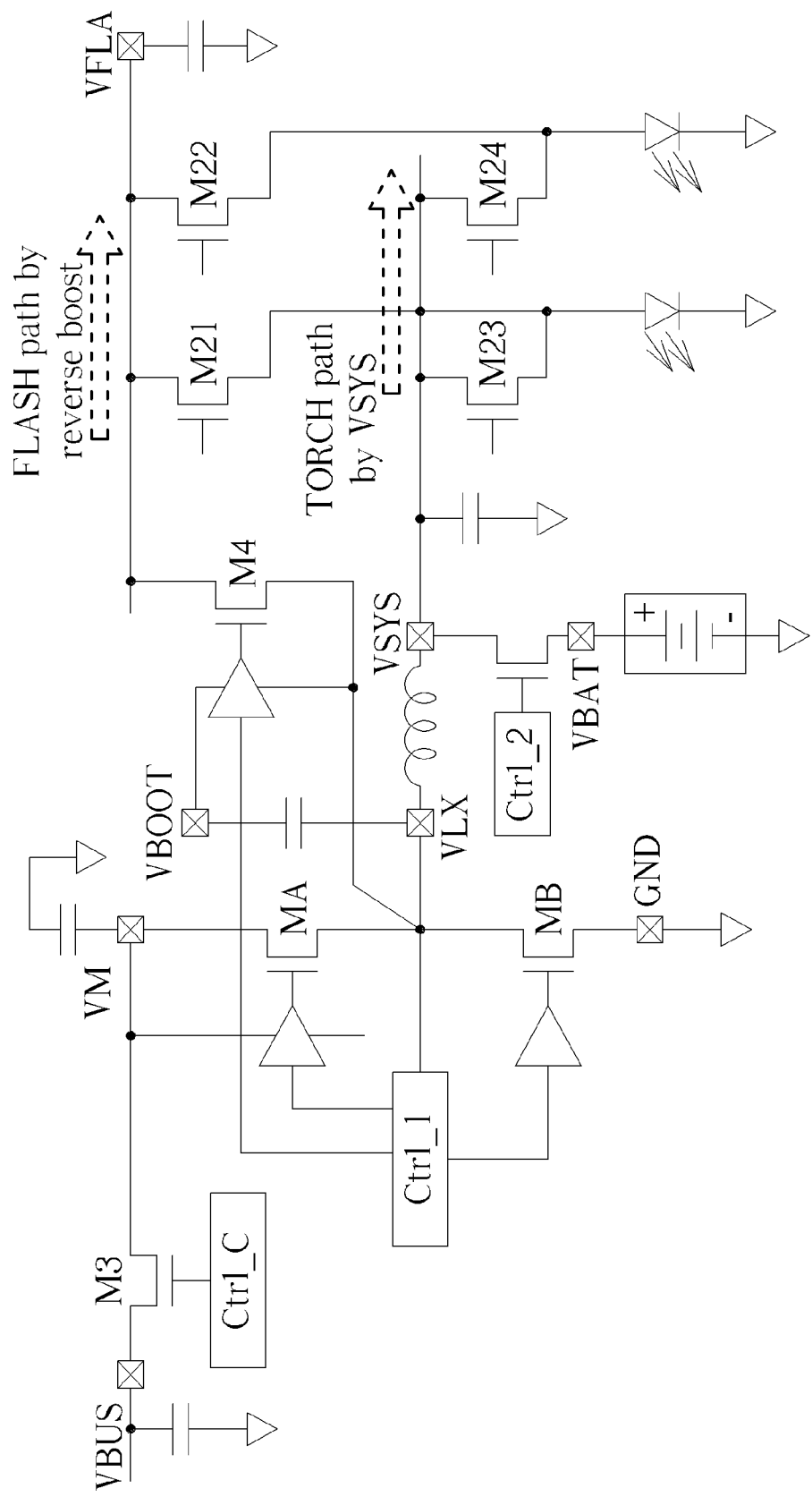
FIG. 5 is a diagram of an apparatus for performing hybrid power control in an electronic device according to another embodiment of the present invention.

FIG. 5 is a diagram of an apparatus for performing hybrid power control in an electronic device according to another embodiment of the present invention. In comparison with the apparatus shown in FIG. 3, while the MOSFET M4 may still be an NMOSFET, the MOSFET MA may be a PMOSFET, and the driving voltage levels respectively applied to the upper and the lower driving voltage terminals of the driver controlling the gate of the MOSFET MA, together with the associated connections, may be changed accordingly. For brevity, similar descriptions for this embodiment are not repeated in detail here.

According to some embodiments, in comparison with the apparatus shown in FIG. 3, each of the MOSFETs MA and M4 may be a PMOSFET, the driving voltage levels respectively applied to the upper and the lower driving voltage terminals of the driver controlling the gate of the MOSFET MA, together with the associated connections, may be changed accordingly as shown in FIG. 5, and the driving voltage levels respectively applied to the upper and the lower driving voltage terminals of the driver controlling the gate of the MOSFET M4, together with the associated connections, may be changed accordingly as shown in FIG. 4. In addition, in the apparatus of any of these embodiments, it is unnecessary to implement the capacitor between the terminals VLX and VBOOT shown in FIG. 3. For brevity, similar descriptions for these embodiments are not repeated in detail here.

Figure 6:
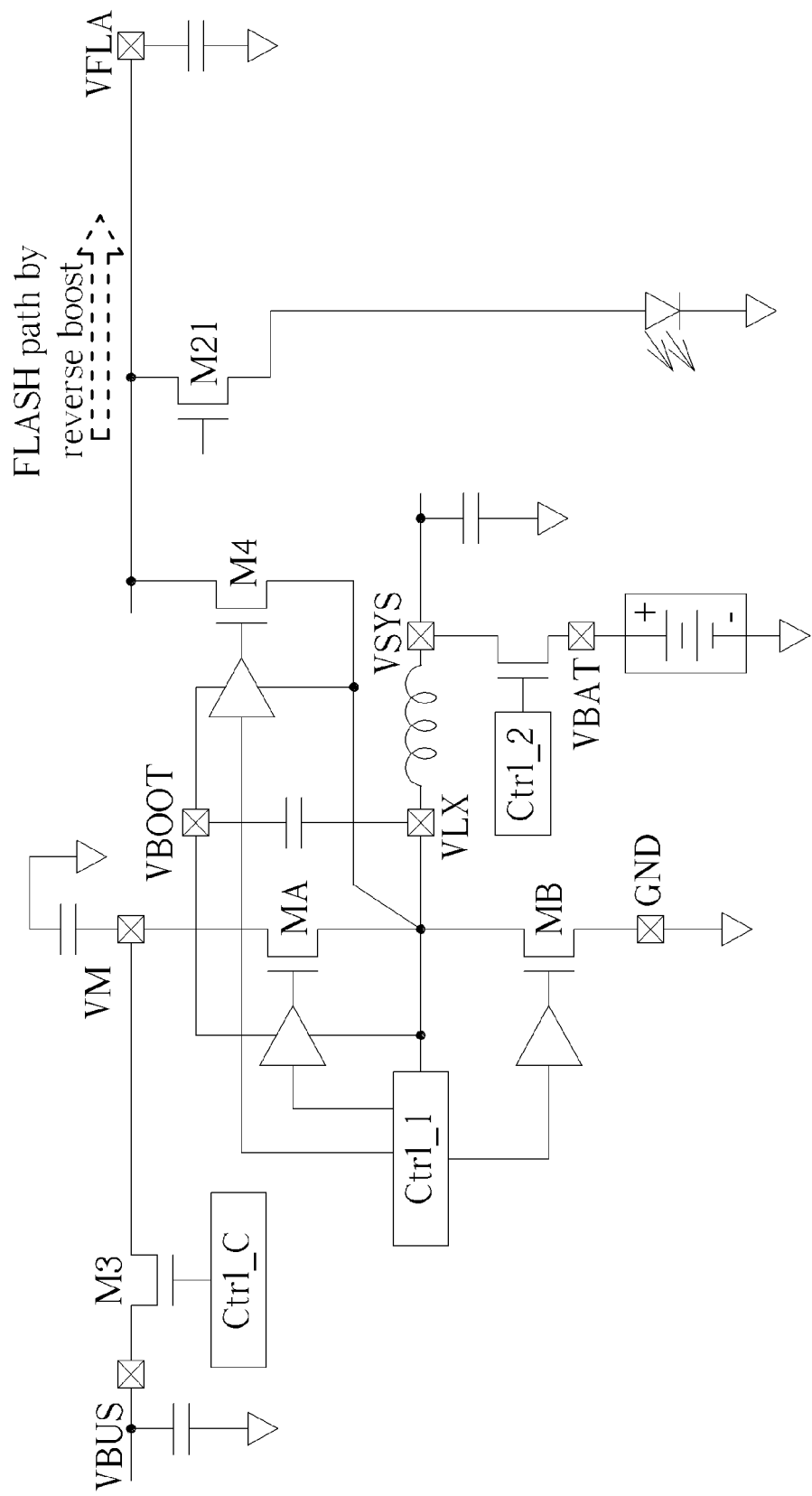
FIG. 6 is a diagram of an apparatus for performing hybrid power control in an electronic device according to another embodiment of the present invention.

FIG. 6 is a diagram of an apparatus for performing hybrid power control in an electronic device according to another embodiment of the present invention. In comparison with the apparatus shown in FIG. 3, the number of LEDs is reduced and the torch path mentioned above is absent in the apparatus of this embodiment, and the associated connections are changed accordingly. For brevity, similar descriptions for this embodiment are not repeated in detail here.

Figure 7:
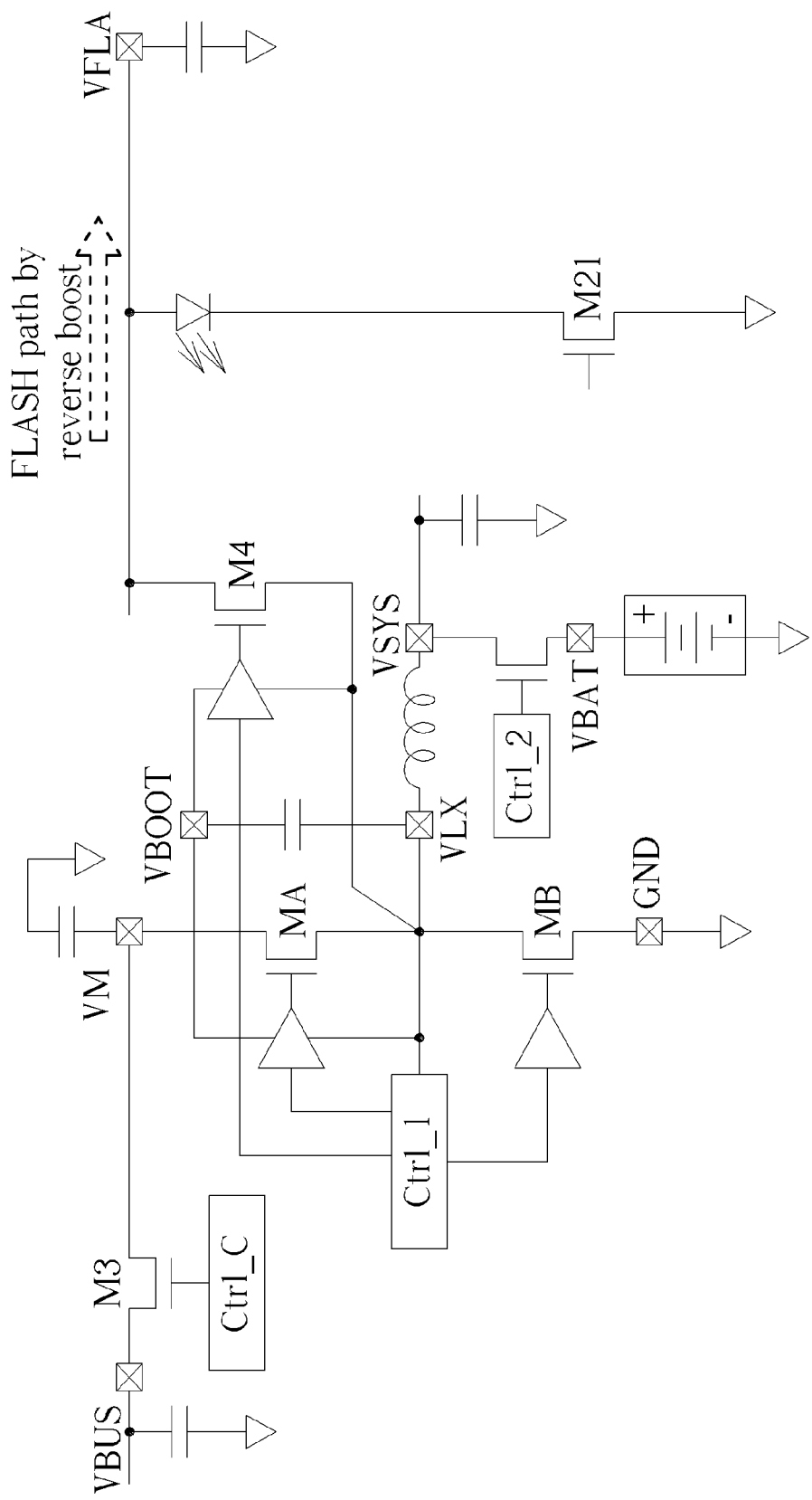
FIG. 7 is a diagram of an apparatus for performing hybrid power control in an electronic device according to another embodiment of the present invention.

FIG. 7 is a diagram of an apparatus for performing hybrid power control in an electronic device according to another embodiment of the present invention. In comparison with the apparatus shown in FIG. 6, in which the MOSFET M21 is coupled between the flash path and the LED, the locations of the MOSFET M21 and the LED is exchanged on the path between the flash path and the ground as shown in FIG. 7. That is, and the LED is coupled between the flash path and the MOSFET M21 in the apparatus of this embodiment. For brevity, similar descriptions for this embodiment are not repeated in detail here.

Figure 8:
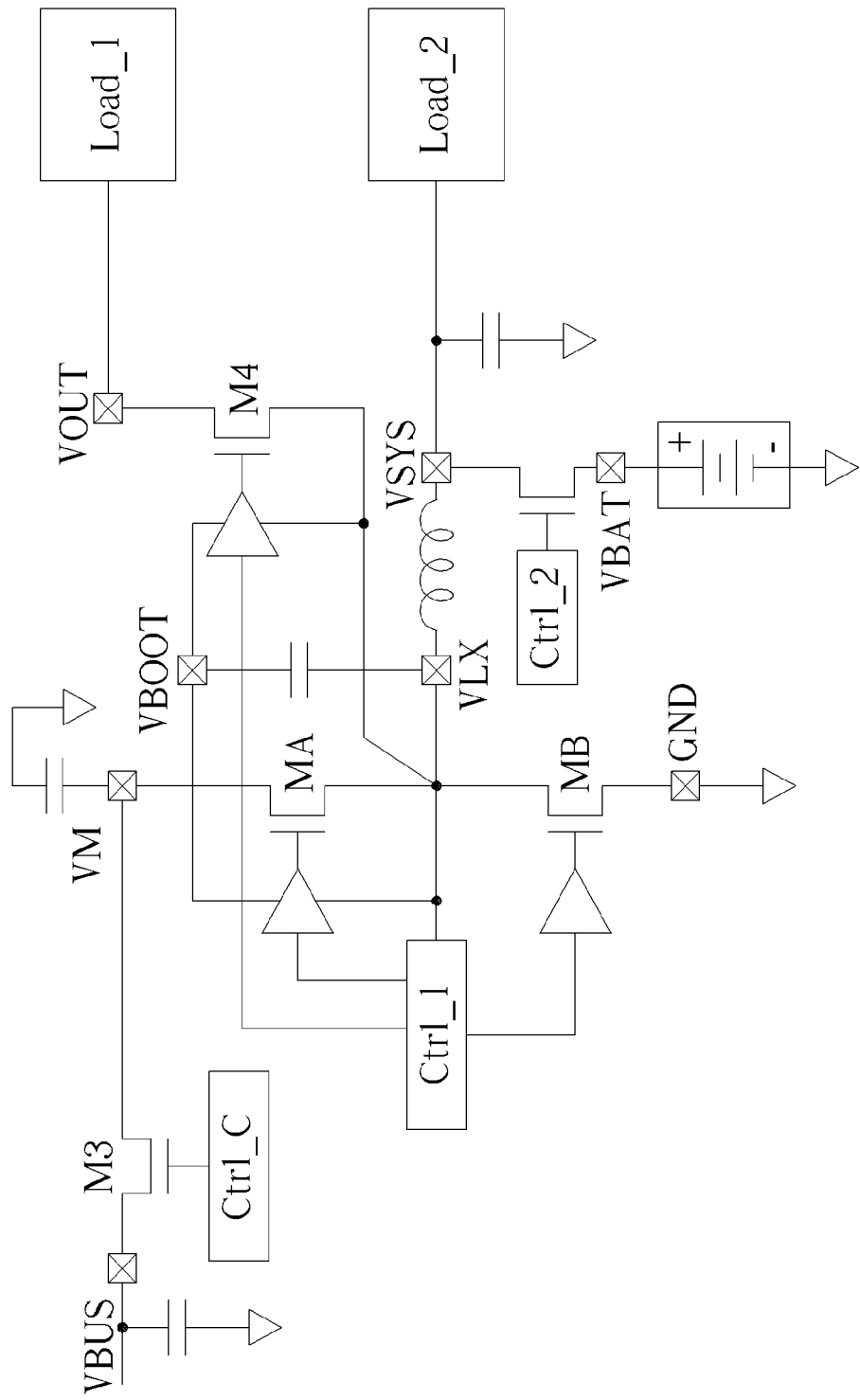
FIG. 8 is a diagram of an apparatus for performing hybrid power control in an electronic device according to another embodiment of the present invention.

FIG. 8 is a diagram of an apparatus for performing hybrid power control in an electronic device according to another embodiment of the present invention. In comparison with the apparatus shown in FIG. 3, the load coupled to the first power output path (e.g. the torch path) is replaced by the load Load_2 coupled to the terminal VSYS in this embodiment, and the load coupled to the second power output path (e.g. the flash path) is replaced by the load Load_1 coupled to the terminal VOUT in this embodiment. For brevity, similar descriptions for this embodiment are not repeated in detail here.

Figure 9:
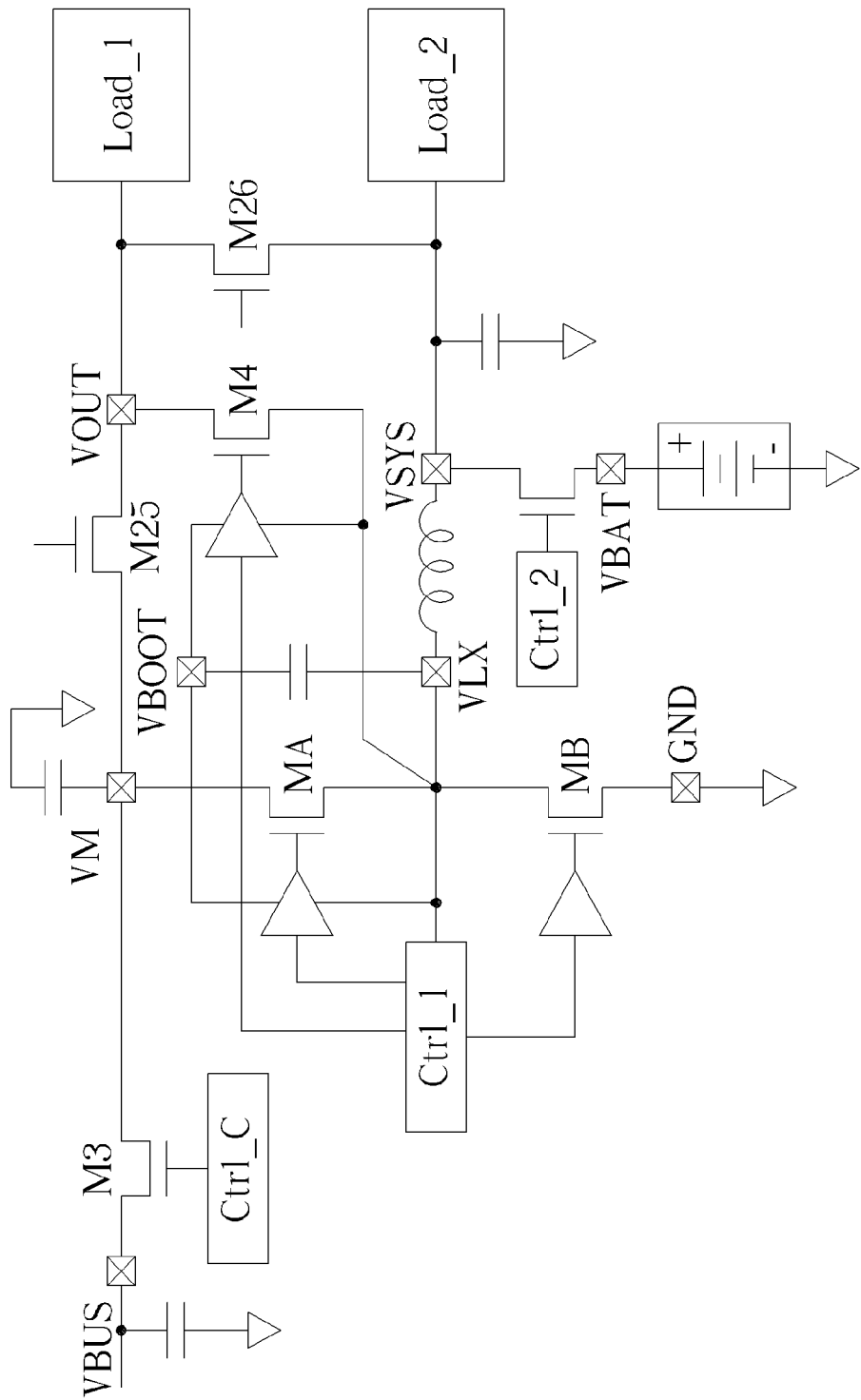
FIG. 9 is a diagram of an apparatus for performing hybrid power control in an electronic device according to another embodiment of the present invention.

FIG. 9 is a diagram of an apparatus for performing hybrid power control in an electronic device according to another embodiment of the present invention. In comparison with the apparatus shown in FIG. 8, the apparatus of this embodiment may further comprise other switching units such as the MOSFETs M25 and M26 and the associated selective conduction paths controlled by these switching units (i.e. the signal path between the terminals VM and VOUT, and the signal path between the terminals VSYS and VOUT). For brevity, similar descriptions for this embodiment are not repeated in detail here.

Figure 10:
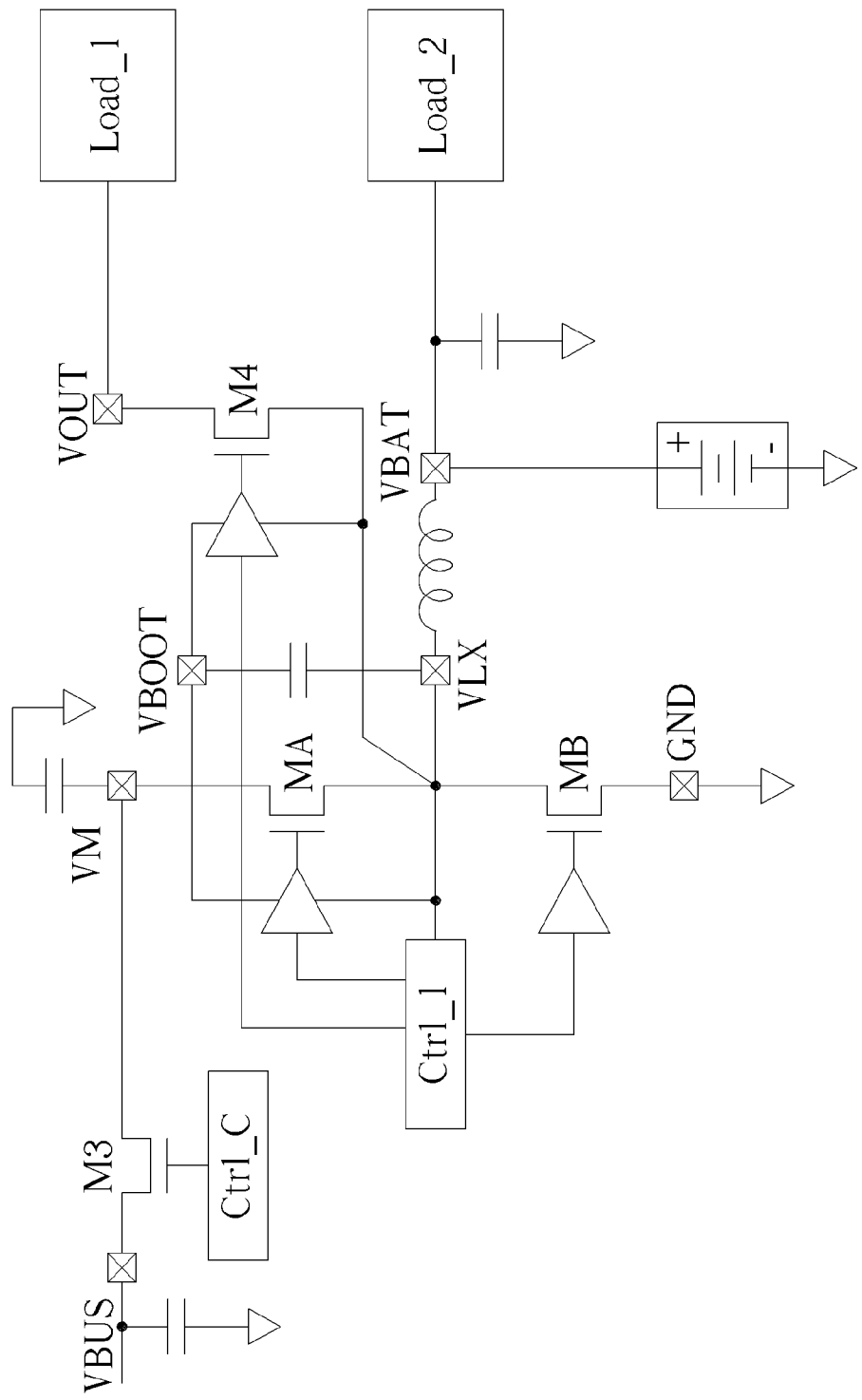
FIG. 10 is a diagram of an apparatus for performing hybrid power control in an electronic device according to another embodiment of the present invention.

FIG. 10 is a diagram of an apparatus for performing hybrid power control in an electronic device according to another embodiment of the present invention. In comparison with the apparatus shown in FIG. 8, at least one component may be omitted in the apparatus of this embodiment. For example, the control circuit Ctrl_2 is absent in the apparatus shown in FIG. 10. For brevity, similar descriptions for this embodiment are not repeated in detail here.

Figure 11:
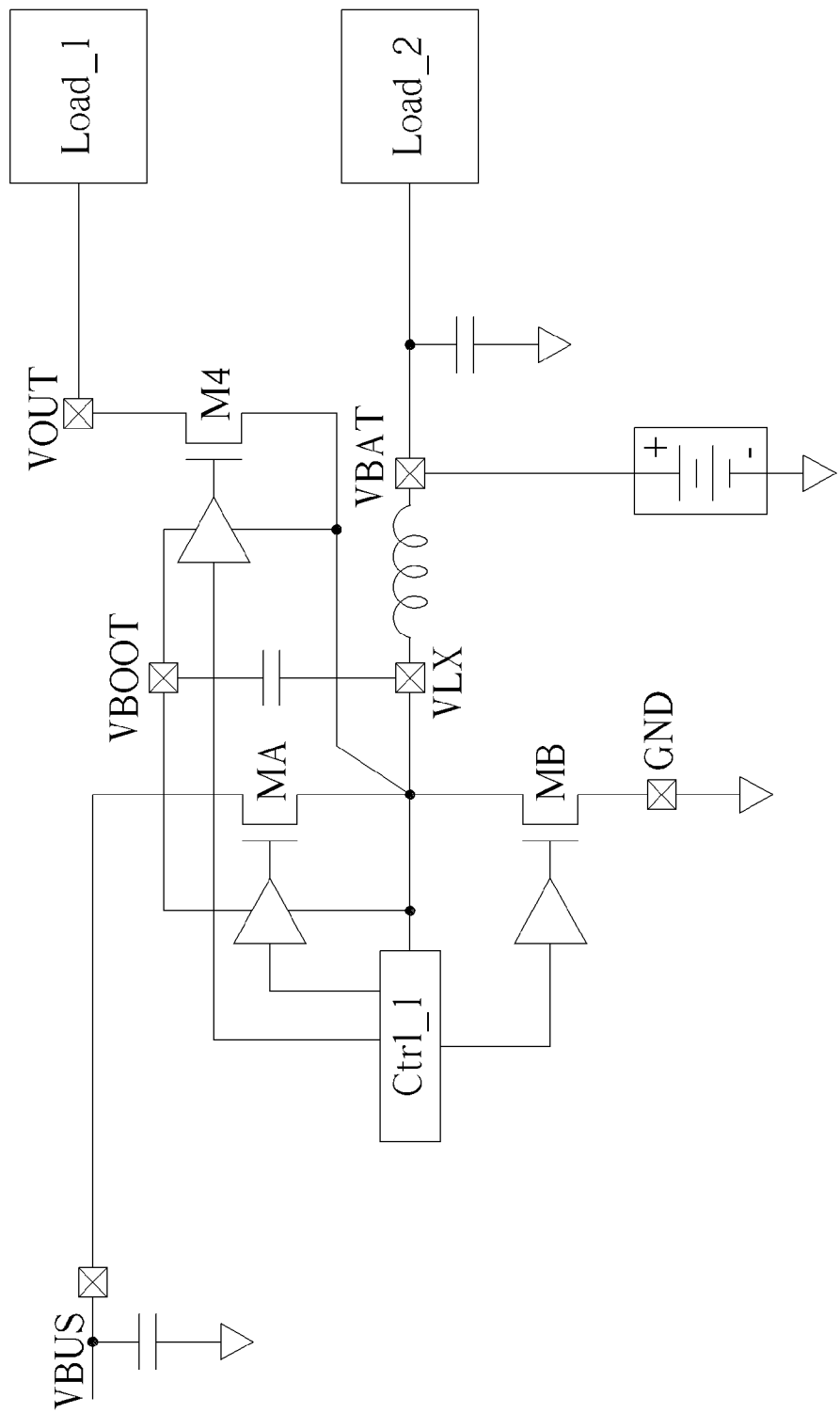
FIG. 11 is a diagram of an apparatus for performing hybrid power control in an electronic device according to another embodiment of the present invention.

FIG. 11 is a diagram of an apparatus for performing hybrid power control in an electronic device according to another embodiment of the present invention. In comparison with the apparatus shown in FIG. 10, some components may be omitted in the apparatus of this embodiment. For example, the control circuit Ctrl_C and the capacitor coupled to the terminal VM are absent in the apparatus shown in FIG. 11. For brevity, similar descriptions for this embodiment are not repeated in detail here.

Figure 12:
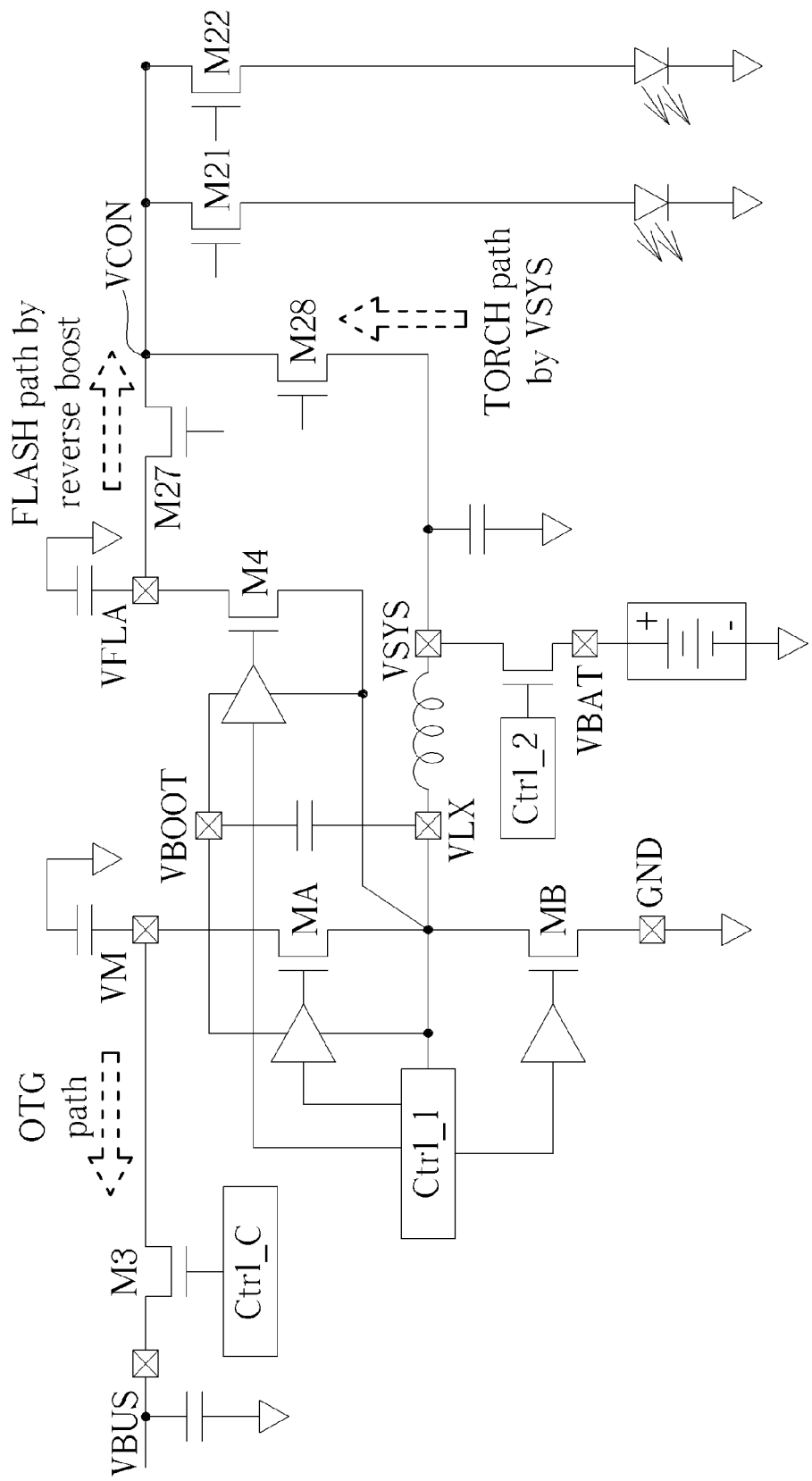
FIG. 12 is a diagram of an apparatus for performing hybrid power control in an electronic device according to another embodiment of the present invention.

FIG. 12 is a diagram of an apparatus for performing hybrid power control in an electronic device according to another embodiment of the present invention. In comparison with the apparatus shown in FIG. 3, the MOSFETs M23 and M24 are absent and the torch path mentioned above is changed in the apparatus of this embodiment, and the associated connections are changed accordingly. As shown in FIG. 12, the positions of the aforementioned terminal VFLA for flash usage and the capacitor connected thereto (i.e. the capacitor connected to the terminal VFLA of the embodiment shown in FIG. 3) are changed in the apparatus of this embodiment, where the terminal VFLA of this embodiment is directly connected to the upper terminal of the MOSFET M4. In addition, the apparatus of this embodiment may further comprise other switching units such as the MOSFETs M27 and M28, and may comprise the associated selective conduction paths controlled by these switching units (i.e. the signal path between the terminals VFLA and VCON, and the signal path between the terminals VSYS and VCON). For example, the apparatus of this embodiment may be utilized as a Universal Serial Bus (USB) On-The-Go (OTG) device. In this situation, the path between the terminals VM and VBUS can be regarded as the OTG path. For brevity, similar descriptions for this embodiment are not repeated in detail here.

Figure 13:
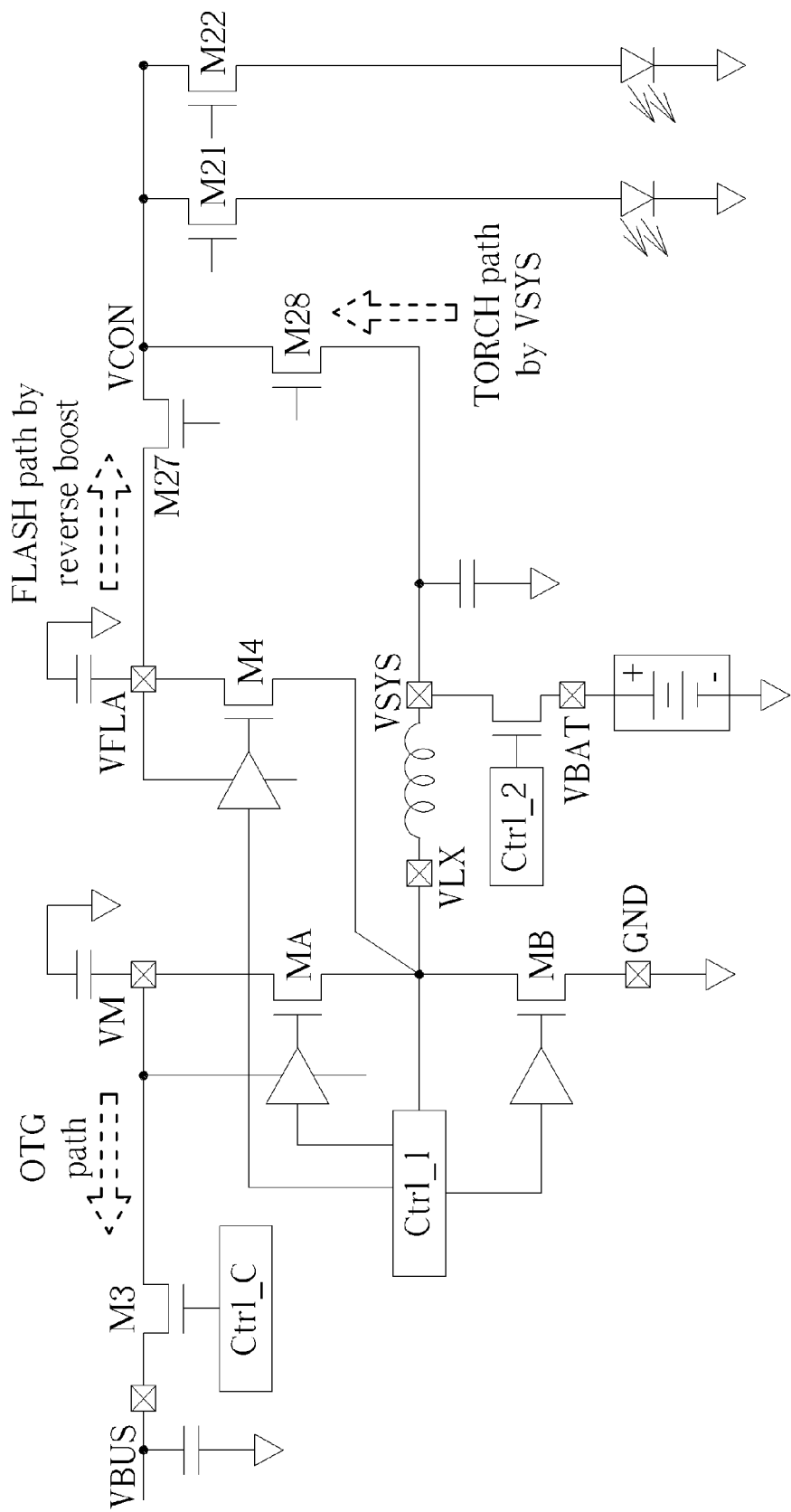
FIG. 13 is a diagram of an apparatus for performing hybrid power control in an electronic device according to another embodiment of the present invention.

FIG. 13 is a diagram of an apparatus for performing hybrid power control in an electronic device according to another embodiment of the present invention. In comparison with the apparatus shown in FIG. 12, the MOSFET MA may be a PMOSFET, and the driving voltage levels respectively applied to the upper and the lower driving voltage terminals of the driver controlling the gate of the MOSFET MA, together with the associated connections, may be changed accordingly. In addition, the MOSFET M4 may be a PMOSFET, and the driving voltage levels respectively applied to the upper and the lower driving voltage terminals of the driver controlling the gate of the MOSFET M4, together with the associated connections, may be changed accordingly. As a result, at least one component within the architecture shown in FIG. 12 may be omitted in the apparatus of this embodiment. For example, the capacitor connected between the terminals VBOOT and VLX of the embodiment shown in FIG. 12 is absent in the apparatus of this embodiment, and therefore, it may be unnecessary to implement the terminal VBOOT of the embodiment shown in FIG. 12 in the apparatus of this embodiment. For brevity, similar descriptions for this embodiment are not repeated in detail here.

Figure 1:
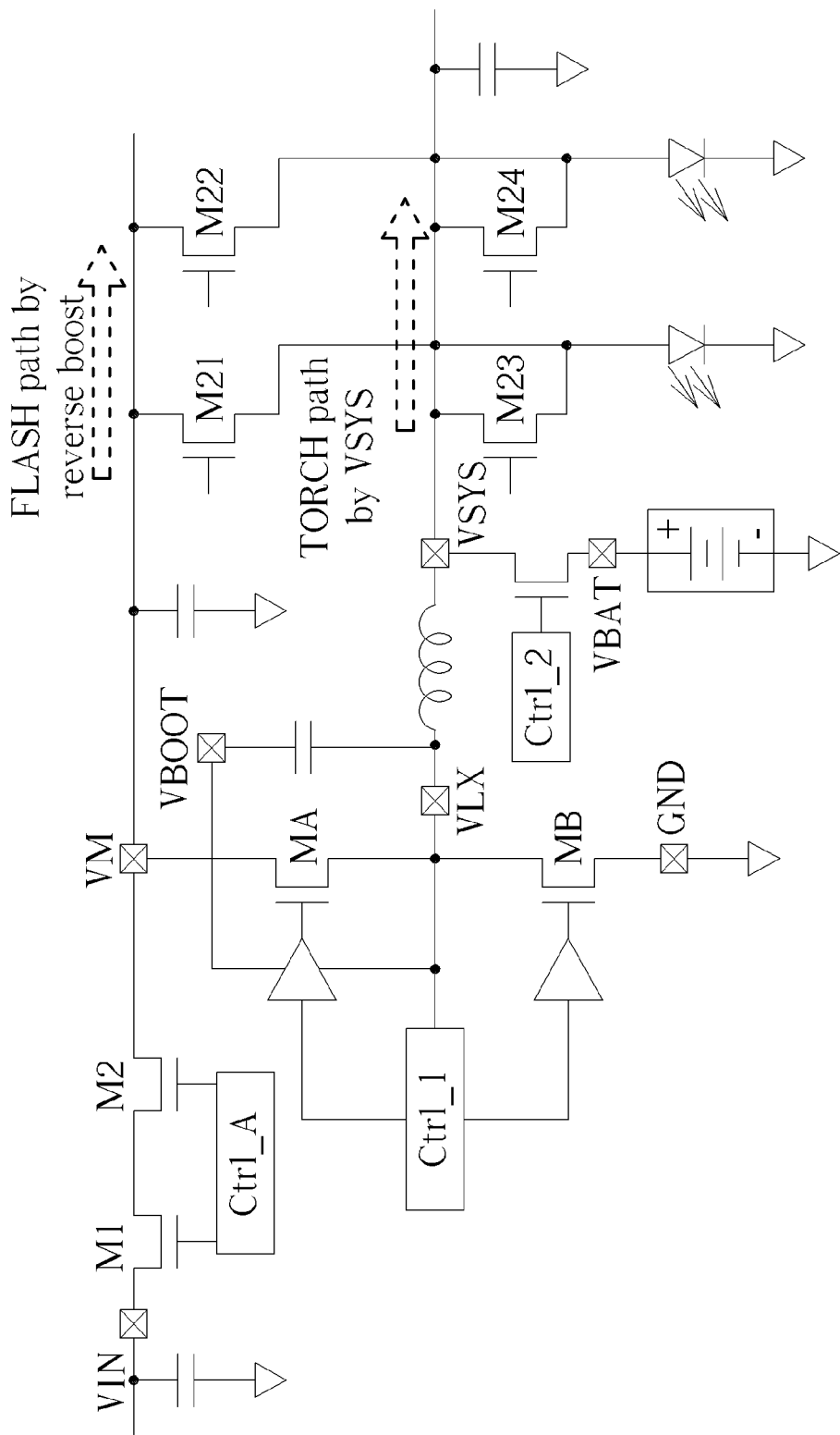
FIG. 1 illustrates a conventional charger system according to the related art.
Figure 2:
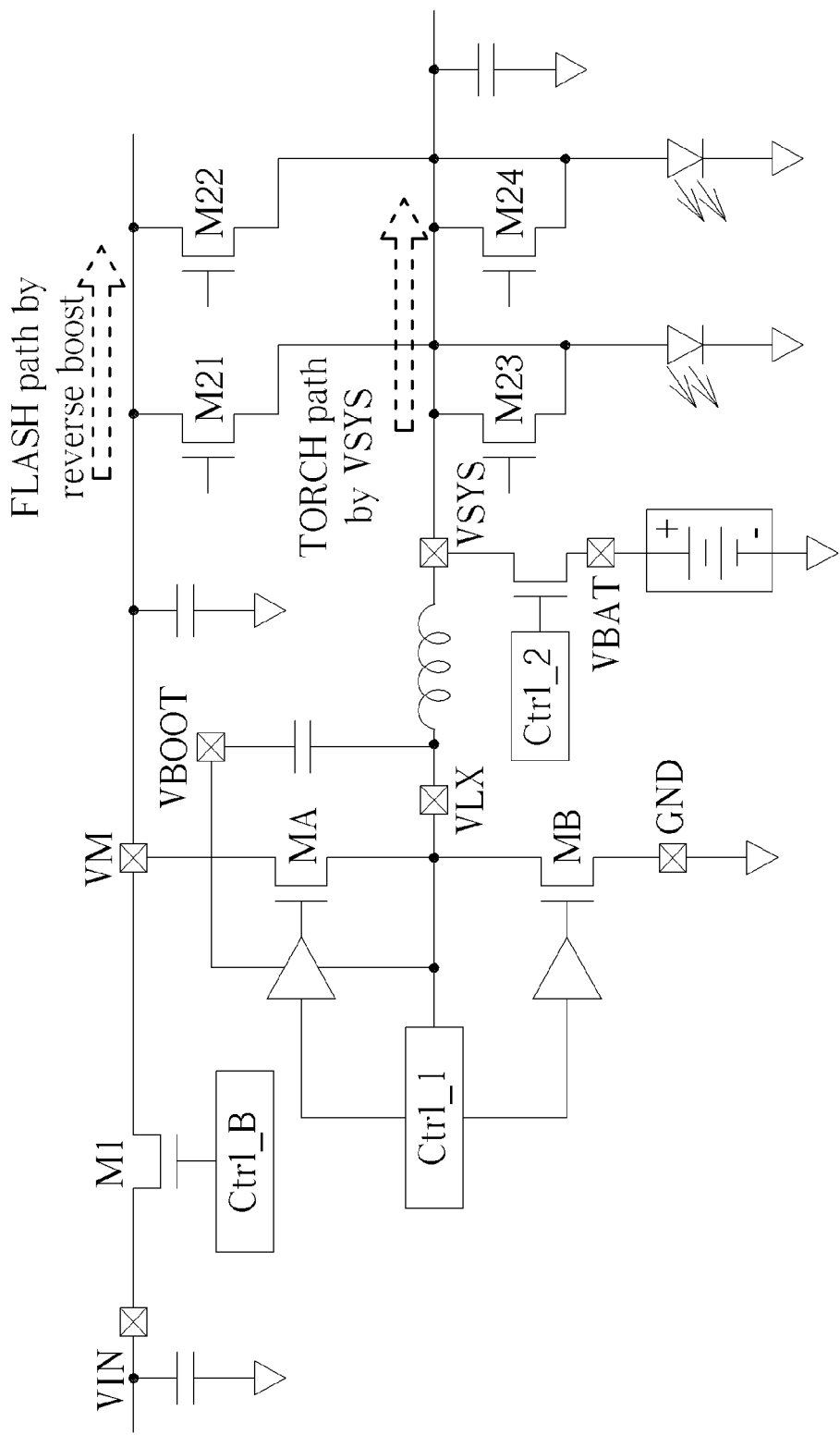
FIG. 2 illustrates another conventional charger system according to the related art.

It is an advantage of the present invention that the present invention apparatus (e.g. the apparatus in any the embodiments described above, such as that of any of FIGS. 3-13) can increase the power efficiency in each of various situations. For example, by implementing only one switching unit (e.g. the MOSFET M3) between the first terminal and the second terminal, the power efficiency on the power transmission path from the terminal VBUS to the terminal VSYS in the present invention apparatus is greater than the power efficiency on the power transmission path from the terminal VIN to the terminal VSYS in the conventional charger system shown in FIG. 1. In addition, by utilizing the present invention apparatus, the related art problem that the MOSFET M1 cannot fully block the path between the terminals VIN and VM in each of various situations is no longer an issue. For example, as the second power output path such as the flash path in the present invention apparatus receives power from the third terminal such as the terminal VLX, rather than the second terminal such as the terminal VM, and as the terminal VLX and the terminal VM are separated power output nodes, while the body diode direction of the MOSFET M3 may be equivalent to the direction from the first terminal (e.g. the terminal next to the terminal VBUS) to the second terminal (e.g. the terminal VM), it is unnecessary that the reverse boost voltage level at the terminal VFLA for flash usage is higher than the input voltage level at the terminal VBUS. As a result, the power efficiency on the power transmission path from the terminal VSYS to the terminal VFLA in the present invention apparatus can be greater than the power transmission path from the terminal VSYS to the terminal VM in the conventional charger system shown in FIG. 2. In conclusion, the present invention apparatus can guarantee high power efficiency in each of various situations. Therefore, the present invention apparatus can enhance the overall performance of the electronic device.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. An apparatus for performing hybrid power control in an electronic device, the apparatus comprising:
an integrated circuit (IC) arranged for implementing at least one portion of a charger, the charger positioned in the electronic device, the charger arranged for selectively charging a battery of the electronic device, wherein the at least one portion of the charger is implemented within a charger chip, and the charger comprises:
a first terminal, positioned on the charger chip, arranged for coupling the charger to a power input port of the electronic device, wherein the power input port is utilized for selectively obtaining external power from outside the electronic device;
a second terminal, positioned on the charger chip and selectively coupled to the first terminal, wherein the second terminal is utilized for selectively inputting the external power into at least one internal component of the charger chip when needed;
a third terminal, positioned on the charger chip and selectively coupled to the second terminal, arranged for interconnecting partial paths between components within the charger, wherein the third terminal is utilized for selectively bypassing the external power when needed;
a fourth terminal, positioned on the charger chip and coupled to the third terminal, arranged for interconnecting a battery path from the battery and another partial path within the charger;
a first power output path, coupled to the fourth terminal, arranged for providing a first voltage level; and
a second power output path, coupled to the third terminal, arranged for selectively providing a second voltage level, wherein the second voltage level is greater than the first voltage level.

2. The apparatus of claim 1, wherein the charger further comprises:
a switching unit, coupled between the first terminal and the second terminal, arranged for selectively enabling or disabling a signal path between the first terminal and the second terminal, wherein no other switching unit is coupled between the first terminal and the second terminal.

3. The apparatus of claim 2, wherein the switching unit is a Metal Oxide Semiconductor Field Effect Transistor (MOSFET) positioned on the charger chip, and a body diode direction of the MOSFET is equivalent to a direction from the first terminal to the second terminal on the signal path.

4. The apparatus of claim 1, wherein the charger further comprises:
a switching unit, coupled between the second terminal and the third terminal, arranged for selectively enabling or disabling a signal path between the second terminal and the third terminal.

5. The apparatus of claim 4, wherein the switching unit is a Metal Oxide Semiconductor Field Effect Transistor (MOSFET) positioned on the charger chip, and a body diode direction of the MOSFET is equivalent to a direction from the third terminal to the second terminal on the signal path.

6. The apparatus of claim 4, wherein when the second power output path is outputting power toward a load within the electronic device, the apparatus utilizes the switching unit to disable the signal path between the second terminal and the third terminal.

7. The apparatus of claim 1, wherein the charger further comprises:
a ground terminal, positioned on the charger chip; and
a switching unit, coupled between the third terminal and the ground terminal, arranged for selectively enabling or disabling a signal path between the third terminal and the ground terminal.

8. The apparatus of claim 7, wherein the switching unit is a Metal Oxide Semiconductor Field Effect Transistor (MOSFET) positioned on the charger chip, and a body diode direction of the MOSFET is equivalent to a direction from the ground terminal to the third terminal on the signal path.

9. The apparatus of claim 1, wherein the charger further comprises:
a fifth terminal, positioned on the charger chip, arranged for coupling an external component of the charger chip to the charger chip; and
a switching unit, coupled between the third terminal and the fifth terminal, arranged for selectively enabling or disabling a signal path between the third terminal and the fifth terminal, wherein the second power output path is coupled to the third terminal through the switching unit.

10. The apparatus of claim 9, wherein the switching unit is a Metal Oxide Semiconductor Field Effect Transistor (MOSFET) positioned on the charger chip, and a body diode direction of the MOSFET is equivalent to a direction from the third terminal to the fifth terminal on the signal path.

11. The apparatus of claim 9, wherein the charger further comprises:
a first other switching unit, coupled between the second terminal and the third terminal, arranged for selectively enabling or disabling a signal path between the second terminal and the third terminal;
a ground terminal, positioned on the charger chip;
a second other switching unit, coupled between the third terminal and the ground terminal, arranged for selectively enabling or disabling a signal path between the third terminal and the ground terminal; and
a third other switching unit, coupled between the first terminal and the second terminal, arranged for selectively enabling or disabling a signal path between the first terminal and the second terminal, wherein no other switching unit is coupled between the first terminal and the second terminal.

12. The apparatus of claim 11, wherein when the switching unit and the second other switching unit are programmed as a portion of a boost circuit within the charger, for outputting power through the second power output path, the third other switching unit disables the signal path between the first terminal and the second terminal and the first other switching unit disables the signal path between the second terminal and the third terminal.

13. The apparatus of claim 11, wherein when the first other switching unit, the second other switching unit, and the third other switching unit are programmed as a portion of a buck circuit within the charger, for transmitting the external power to the fourth terminal, the switching unit disables the signal path between the third terminal and the fifth terminal.

14. The apparatus of claim 1, further comprising:
at least one switching unit, coupled to at least one load within the electric device and coupled to at least one power output path within the first power output path and the second power output path, arranged for selectively driving the at least one load with power output through one of the first power output path and the second power output path.

15. The apparatus of claim 1, wherein the charger further comprises:
a switching unit, coupled between the fourth terminal and the battery, arranged for selectively enabling or disabling a signal path between the fourth terminal and the battery.

16. The apparatus of claim 1, wherein the battery is electrically connected to the fourth terminal, directly.

17. The apparatus of claim 1, wherein the charger further comprises an inductor coupled between the third terminal and the fourth terminal.

18. The apparatus of claim 1, wherein the charger further comprises a capacitor that is coupled to the third terminal.

19. The apparatus of claim 1, wherein the charger further comprises a capacitor that is coupled to the second terminal.

20. The apparatus of claim 1, wherein the first power output path is arranged for providing a load within the electronic device with the first voltage level;
and the second power output path is arranged for selectively providing another load within the electronic device with the second voltage level.

21. An apparatus for performing hybrid power control in an electronic device, the apparatus comprising:
a charger chip arranged for implementing at least one portion of a charger, the charger positioned in the electronic device, the charger arranged for selectively charging a battery of the electronic device, wherein the at least one portion of the charger is implemented within the charger chip, and the charger comprises:
a first terminal, positioned on the charger chip, arranged for coupling the charger to a power input port of the electronic device, wherein the power input port is utilized for selectively obtaining external power from outside the electronic device;
a second terminal, positioned on the charger chip and selectively coupled to the first terminal, wherein the second terminal is utilized for selectively inputting the external power into at least one internal component of the charger chip when needed;
a third terminal, positioned on the charger chip and selectively coupled to the second terminal, arranged for interconnecting partial paths between components within the charger, wherein the third terminal is utilized for selectively bypassing the external power when needed;
a fourth terminal, positioned on the charger chip and coupled to the third terminal, arranged for interconnecting a battery path from the battery and another partial path within the charger;
a first power output path, coupled to the fourth terminal, arranged for providing a first voltage level; and
a second power output path, coupled to the third terminal, arranged for selectively providing a second voltage level, wherein the second voltage level is greater than the first voltage level.

22. The apparatus of claim 21, wherein the charger further comprises:
a switching unit, coupled between the first terminal and the second terminal, arranged for selectively enabling or disabling a signal path between the first terminal and the second terminal, wherein no other switching unit is coupled between the first terminal and the second terminal.

23. The apparatus of claim 22, wherein the switching unit is a Metal Oxide Semiconductor Field Effect Transistor (MOSFET) positioned on the charger chip, and a body diode direction of the MOSFET is equivalent to a direction from the first terminal to the second terminal on the signal path.

24. The apparatus of claim 21, wherein the charger further comprises:
a switching unit, coupled between the second terminal and the third terminal, arranged for selectively enabling or disabling a signal path between the second terminal and the third terminal.

25. The apparatus of claim 24, wherein the switching unit is a Metal Oxide Semiconductor Field Effect Transistor (MOSFET) positioned on the charger chip, and a body diode direction of the MOSFET is equivalent to a direction from the third terminal to the second terminal on the signal path.

26. The apparatus of claim 24, wherein when the second power output path is outputting power toward a load within the electronic device, the apparatus utilizes the switching unit to disable the signal path between the second terminal and the third terminal.

27. The apparatus of claim 21, wherein the charger further comprises:
a ground terminal, positioned on the charger chip; and
a switching unit, coupled between the third terminal and the ground terminal, arranged for selectively enabling or disabling a signal path between the third terminal and the ground terminal.

28. The apparatus of claim 27, wherein the switching unit is a Metal Oxide Semiconductor Field Effect Transistor (MOSFET) positioned on the charger chip, and a body diode direction of the MOSFET is equivalent to a direction from the ground terminal to the third terminal on the signal path.

29. The apparatus of claim 21, wherein the charger further comprises:
a fifth terminal, positioned on the charger chip, arranged for coupling an external component of the charger chip to the charger chip; and
a switching unit, coupled between the third terminal and the fifth terminal, arranged for selectively enabling or disabling a signal path between the third terminal and the fifth terminal, wherein the second power output path is coupled to the third terminal through the switching unit.

30. The apparatus of claim 29, wherein the switching unit is a Metal Oxide Semiconductor Field Effect Transistor (MOSFET) positioned on the charger chip, and a body diode direction of the MOSFET is equivalent to a direction from the third terminal to the fifth terminal on the signal path.

31. The apparatus of claim 29, wherein the charger further comprises:
a first other switching unit, coupled between the second terminal and the third terminal, arranged for selectively enabling or disabling a signal path between the second terminal and the third terminal;
a ground terminal, positioned on the charger chip;
a second other switching unit, coupled between the third terminal and the ground terminal, arranged for selectively enabling or disabling a signal path between the third terminal and the ground terminal; and
a third other switching unit, coupled between the first terminal and the second terminal, arranged for selectively enabling or disabling a signal path between the first terminal and the second terminal, wherein no other switching unit is coupled between the first terminal and the second terminal.

32. The apparatus of claim 31, wherein when the switching unit and the second other switching unit are programmed as a portion of a boost circuit within the charger, for outputting power through the second power output path, the third other switching unit disables the signal path between the first terminal and the second terminal and the first other switching unit disables the signal path between the second terminal and the third terminal.

33. The apparatus of claim 31, wherein when the first other switching unit, the second other switching unit, and the third other switching unit are programmed as a portion of a buck circuit within the charger, for transmitting the external power to the fourth terminal, the switching unit disables the signal path between the third terminal and the fifth terminal.

34. The apparatus of claim 21, further comprising:
at least one switching unit, coupled to at least one load within the electric device and coupled to at least one power output path within the first power output path and the second power output path, arranged for selectively driving the at least one load with power output through one of the first power output path and the second power output path.

35. The apparatus of claim 21, wherein the charger further comprises:
a switching unit, coupled between the fourth terminal and the battery, arranged for selectively enabling or disabling a signal path between the fourth terminal and the battery.

36. The apparatus of claim 21, wherein the battery is electrically connected to the fourth terminal, directly.

37. The apparatus of claim 21, wherein the charger further comprises an inductor coupled between the third terminal and the fourth terminal.

38. The apparatus of claim 21, wherein the charger further comprises a capacitor that is coupled to the third terminal.

39. The apparatus of claim 21, wherein the charger further comprises a capacitor that is coupled to the second terminal.

40. The apparatus of claim 21, wherein the first power output path is arranged for providing a load within the electronic device with the first voltage level; and the second power output path is arranged for selectively providing another load within the electronic device with the second voltage level.

* * * * *